United States Patent
Vincent et al.

(10) Patent No.: US 6,943,540 B2
(45) Date of Patent: Sep. 13, 2005

(54) MULTIPLE-CHANNEL SOLENOID CURRENT MONITOR

(75) Inventors: Kenneth Vincent, Alcester (GB); James Henton Wilson, Coventry (GB)

(73) Assignee: TRW Limited (GB)

( * ) Notice: Subject to any disclaimer, the term of this patent is extended or adjusted under 35 U.S.C. 154(b) by 26 days.

(21) Appl. No.: 10/399,095

(22) PCT Filed: Oct. 15, 2001

(86) PCT No.: PCT/GB01/04608
§ 371 (c)(1),
(2), (4) Date: Jun. 27, 2003

(87) PCT Pub. No.: WO02/33425
PCT Pub. Date: Apr. 25, 2002

(65) Prior Publication Data
US 2004/0012380 A1 Jan. 22, 2004

(30) Foreign Application Priority Data
Oct. 14, 2000 (GB) .............................. 0025236

(51) Int. Cl.$^7$ .................. G01R 31/06; H01H 47/00; G01L 5/28
(52) U.S. Cl. .................. 324/158.1; 324/546; 361/191; 361/139; 73/121
(58) Field of Search ................. 361/160, 166, 361/167, 168.1, 169.1, 191; 324/145, 546, 158.1, 117; 73/118.1, 121, 116, 132

(56) References Cited

U.S. PATENT DOCUMENTS

| | | | | |
|---|---|---|---|---|
| 3,823,366 A | * | 7/1974 | Fabry | 324/423 |
| 4,266,261 A | * | 5/1981 | Streit et al. | 361/154 |
| 4,932,246 A | | 6/1990 | Deutsch et al. | |
| 4,939,928 A | * | 7/1990 | Carle et al. | 73/118.1 |
| 5,583,434 A | * | 12/1996 | Moyers et al. | 324/207.16 |
| 5,621,604 A | * | 4/1997 | Carlson | 361/166 |
| 5,650,726 A | * | 7/1997 | Gasnier et al. | 324/339 |
| 5,818,678 A | * | 10/1998 | Berg et al. | 361/152 |
| 5,859,533 A | * | 1/1999 | Gasnier et al. | 324/339 |
| 5,909,353 A | * | 6/1999 | Alberter et al. | 361/191 |
| 5,936,827 A | * | 8/1999 | Dressler et al. | 361/154 |
| 5,959,825 A | * | 9/1999 | Harcombe | 361/154 |
| 5,995,356 A | * | 11/1999 | Glavmo et al. | 361/154 |
| 6,019,441 A | * | 2/2000 | Lloyd et al. | 303/156 |
| 6,155,282 A | * | 12/2000 | Zachary et al. | 137/1 |
| 6,317,308 B1 | * | 11/2001 | Durif et al. | 361/143 |
| 6,771,479 B2 | * | 8/2004 | Vanheesbeke | 361/152 |
| 2004/0057183 A1 | * | 3/2004 | Vincent et al. | 361/118 |

FOREIGN PATENT DOCUMENTS

JP 2000112541 4/2000

* cited by examiner

*Primary Examiner*—Paresh Patel
(74) *Attorney, Agent, or Firm*—MacMillan, Sobanski & Todd, LLC

(57) ABSTRACT

An arrangement for monioring multiple channel solenoid currents wherein a plurality of separately controllable solenoid coils are coupled commonly by a single current measurement element to one side of a current supply.

13 Claims, 4 Drawing Sheets

MULTIPLE-CHANNEL SOLENOID CURRENT MONITOR

CROSS REFERENCE TO RELATED APPLICATIONS

This application is a national stage entry International Application No. PCT/GB01/04608 filed Oct. 15, 2001, which claimed priority to Great Britain Patent Application No. 0025236.1 filed Oct. 14, 2000, the disclosures of which are incorporated herein by reference.

BACKGROUND OF THE INVENTION

The present invention is concerned with the monitoring of multiple channel solenoid currents particularly, but not exclusively, in automotive electrical and electronic control systems.

There are many situations in electrical and electronic control systems where there is a requirement for the current flowing in a solenoid coil to be monitored and measured. Conventionally, each channel containing an individual solenoid coil has its own current sensing element associated with it Usually, the sensing element comprises a resistive element, eg. a simple resistor disposed in series with the solenoid coil, whereby the voltage drop across the resistor is proportional to the current flowing through it, and hence proportional to the current flowing through the solenoid coil. The voltage across the resistor is conditioned and read by an analogue to digital converter (ADC).

The known arrangement thus has the associated cost disadvantage that individual sensing elements and conditioning are required for each channel of current to be measured, ie. for each solenoid coil to be monitored.

It would be advantageous to provide, particularly for automotive applications, an arrangement whereby it is no longer necessary for there to be individual sensing elements for each solenoid channel.

SUMMARY OF THE INVENTION

In accordance with the present invention, a plurality of separately controllable solenoid coils are coupled commonly by a single current measurement element to one side of a current supply.

The measurement element can, for example, be coupled to an analogue to digital converter via a signal conditioning amplifier for measurement purposes.

Preferably, the solenoid coils are coupled commonly by said single current measurement element to the low side of the current supply.

In a preferred embodiment, in order to enable the current through any one particular solenoid coil to be measured, means are included for, firstly, enabling a current measurement reading to be made only while a respective drive element for that particular solenoid coil is switched on, and, secondly, switching on the drive element for only that particular coil when the current measurement reading is made, with all other drive elements being switched off.

The first and second means would normally be realized by logic circuit arrangements which are implemented by hardware or software. Software implementation is preferred since the microcomputer which is present in the system for control of the braking system is available for this purpose, so that the additional hardware costs do not arise.

Usually the measurement of the current through the solenoid coils is required for "closed-loop" operation whereby, preferably, the duty cycle of a PWM-signal is varied to control the current through the solenoid coil. Since the present circuit arrangement has a common current measurement element, "closed-loop" operation is not possible. Therefore a so-called "calibration cycle" can be arranged to be passed through for each solenoid coil when the two before-mentioned first and second conditions can be met. During the calibration cycle, the optimum setting for the PWM duty cycle can be learned. Because the calibration cycles are repeated periodically, a reliable operation can be ensured over the whole running period, even though only "normal" control is possible. This means e.g. that in applications where valves are driven, a correct switching behaviour ("OPEN", "CLOSED" respectively) can be guaranteed.

Various objects and advantages of this invention will become apparent to those skilled in the art from the following detailed description of the preferred embodiment, when read in light of the accompanying drawings.

DETAILED DESCRIPTION OF THE INVENTION

Figure 1:
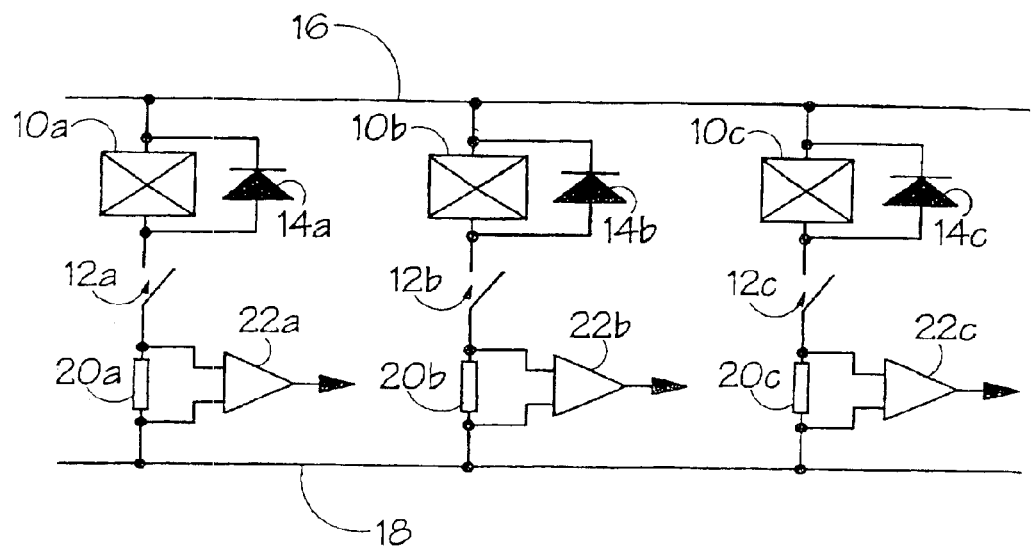
FIG. 1 is a circuit diagram illustrating a typical example of a known arrangement for monitoring multiple solenoid coils.

Referring first to FIG. 1, there is shown a circuit arrangement having three solenoids whose solenoid coils 10a, 10b, 10c are to be monitored. The solenoid coils 10a, 10b, 10c are disposed between a supply line 16 and ground 18 and are controlled by respective series low side switches 12a, 12b, 12c, for example drive FETs. In parallel with each coil 10a, 10b, 10c is a respective recirculation diode 14a, 14b, 14c. In order to measure the current passing through the solenoids 10a, 10b, 10c, there is disposed between each drive FET 12a, 12b, 12c and ground 18 a respective resistor 20a, 20b, 20c, the voltage drop across each resistor 20a, 20b, 20c being measured by a respective amplifier 22a, 22b, 22c. The outputs of the amplifiers 22a, 22b, 22c lead to respective ADC inputs (not shown) for measurement purposes.

Figure 2:
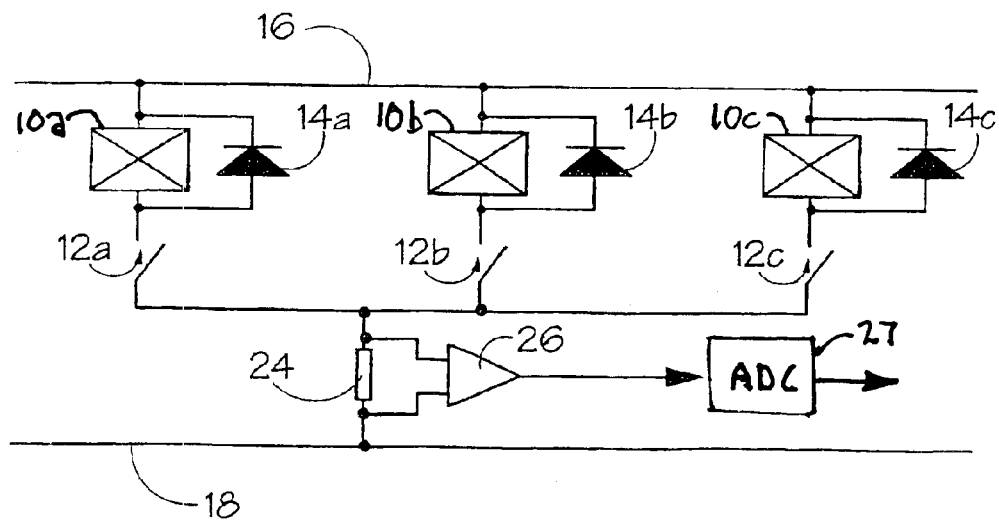
FIG. 2 is a circuit diagram illustrating one embodiment of an arrangement in accordance with the present invention for monitoring multiple solenoid coils.

In the arrangement of FIG. 2 in accordance with the present invention, identical components are given the same reference numerals. In this arrangement, the terminals of three FETs 12a, 12b, 12c remote from the coils 10 are connected together and coupled to ground 18 via a single common resistor 24, the voltage across which is monitored by means of a single amplifier 26. The output of the amplifier 26 is again passed to the input of an analogue to digital converter (ADC) 27 for measurement purposes.

It is emphasised that although the illustrated circuit shows three solenoid coils 10a, 10b, 10c, this is purely by way of example and in practice there could be any number of such coils, commonly coupled to ground 18 by the single sensing resistor 24.

Although the circuit illustrated uses FETs as low side drivers, in principle other drive elements, such as relays, transistors and the like, could be used.

The sensing element formed by resistor 24 in the circuit of FIG. 2 detects the sum of all of the currents flowing through the solenoid coils 10a, 10b, 10c. In order to read the current through any particular single one of the coils 10, two conditions must be met. Firstly, the ADC reading must only be made while the respective drive element 12 for that particular solenoid channel is switched on. Secondly, only the FET 12 for the particular coil 10 being measured should be switched on when the ADC reading is made. All other drive FETs 12 must be switched off. Although not shown in FIG. 2, suitable control circuitry is provided to achieve these two conditions, for example as described hereinafter in connection with FIGS. 4 to 7.

The achievement of the above identified two conditions means essentially that, in order to ensure that a robust measurement can be made, only one active device can be held energized. This is normally achieved through software control of the timing of the solenoid energisations. In principle, it is possible to provide a control circuit as illustrated in the attached modified version of the present FIG. 2 identified as FIG. 4. Here, the output X of the device 26 is read on an input port of a microprocessor 28. The signal X is present when one or more of the solenoids are conducting and with suitable control, as idealized in the flow chart of FIG. 5, the output X can be associated with a specific solenoid. The actual timing of the associated pulses can be seen from the corresponding timing diagram of FIG. 6.

In practice, due to variations in the supply voltage, the period (mark/space ratio) that is required to provide a suitable energisations current for a solenoid varies such that it is likely that the actual pulse periods for all solenoids overlap. In this case, a control method is required that intentionally holds off the energisations of all but the monitored solenoid. This can be achieved by interrupting the normal pattern i.e. normal cycle, of solenoid energisations with a measurement cycle at a prescribed frequency, for example 1 in every 10 normal cycle energisations, and by holding off the energisations of all but the monitored solenoid, measurement of each solenoid being achieved by incrementing through the monitored solenoids on each and every other interruption or measurement cycle. In this control regime there would need to be an intentional disabling of the potentially active devices in order to allow current measurement of the chosen device to take place. By way of example only, the flow chart of FIG. 7 could be included as part of the microprocessor control of the solenoid energisations that could achieve the desired objective. This control method comprises a normal cycle part which allows uninterrupted operation of the solenoids under control, and a measurement cycle part that is evoked every n'th cycle that disables all solenoids then enables the chosen solenoid for subsequent measurement. After measurement, all solenoids are enabled and the chosen solenoid is incremented to the next in the measurement order. Finally the interrupt counter is reset so as to allow the normal cycle to continue.

In arrangements such as those described above, by having only a single sensing resistor and conditioning amplifier, a substantial cost saving can be made.

Figure 3:
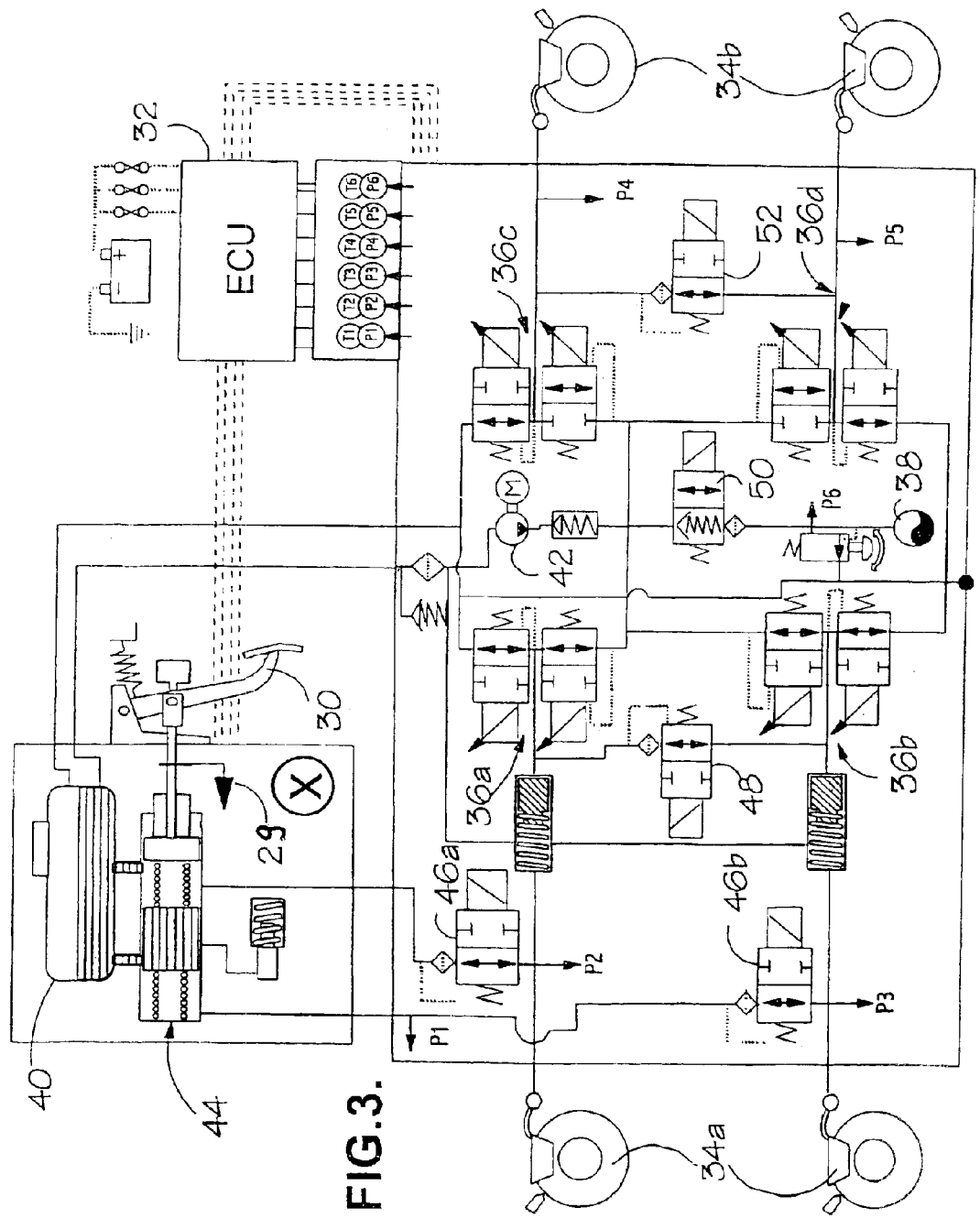
FIG. 3 is an example of an electro hydraulic braking system (EHB) having a plurality of solenoid operated valves to which the present invention can be applied.
Figure 4:
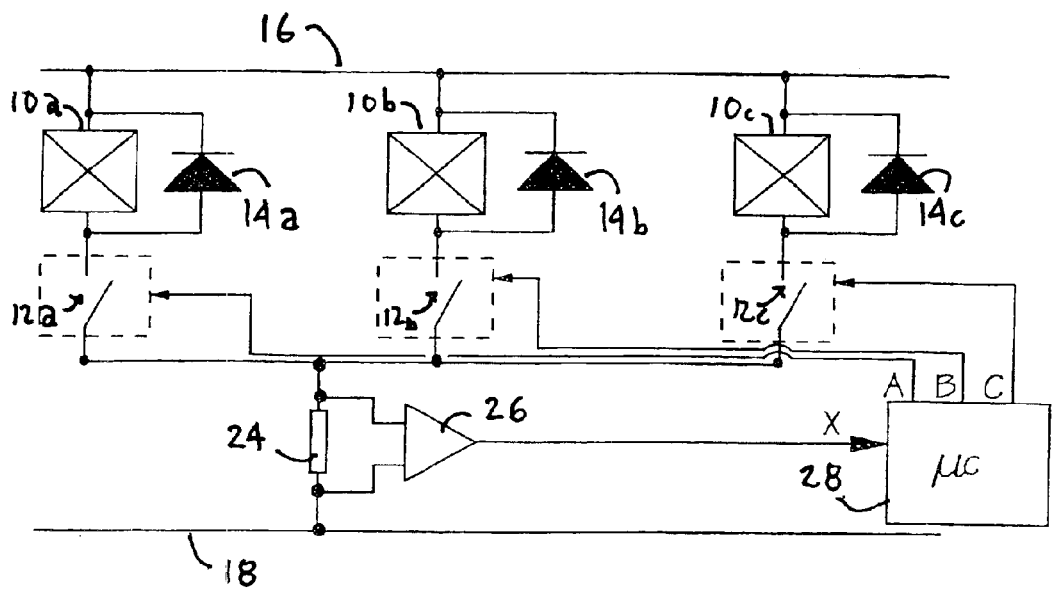
FIG. 4 is a circuit diagram illustrating in principle a technique for achieving the control of the timing of the solenoid energisations to achieve operation in accordance with the present invention.
Figure 5:
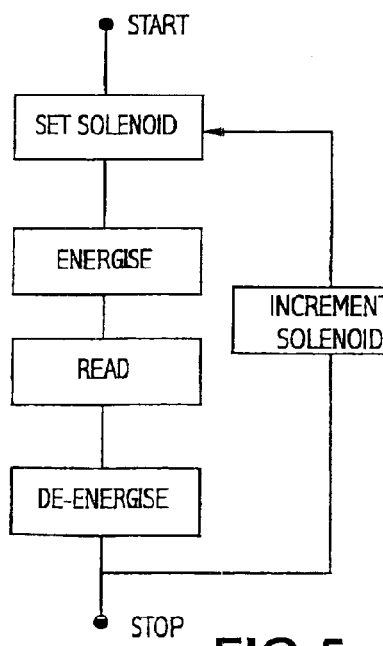
FIG. 5 is a flow diagram illustrating operation of the circuitry of FIG. 4.
Figure 6:
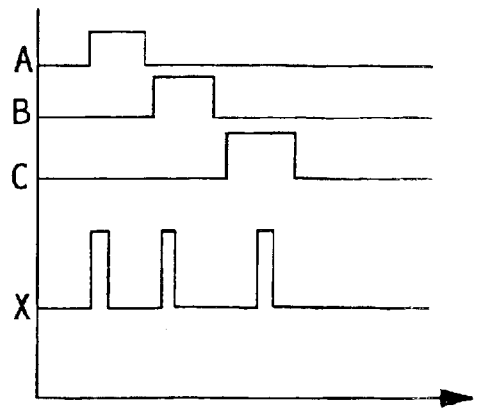
FIG. 6 is a timing diagram corresponding to FIGS. 4 and 5.
Figure 7:
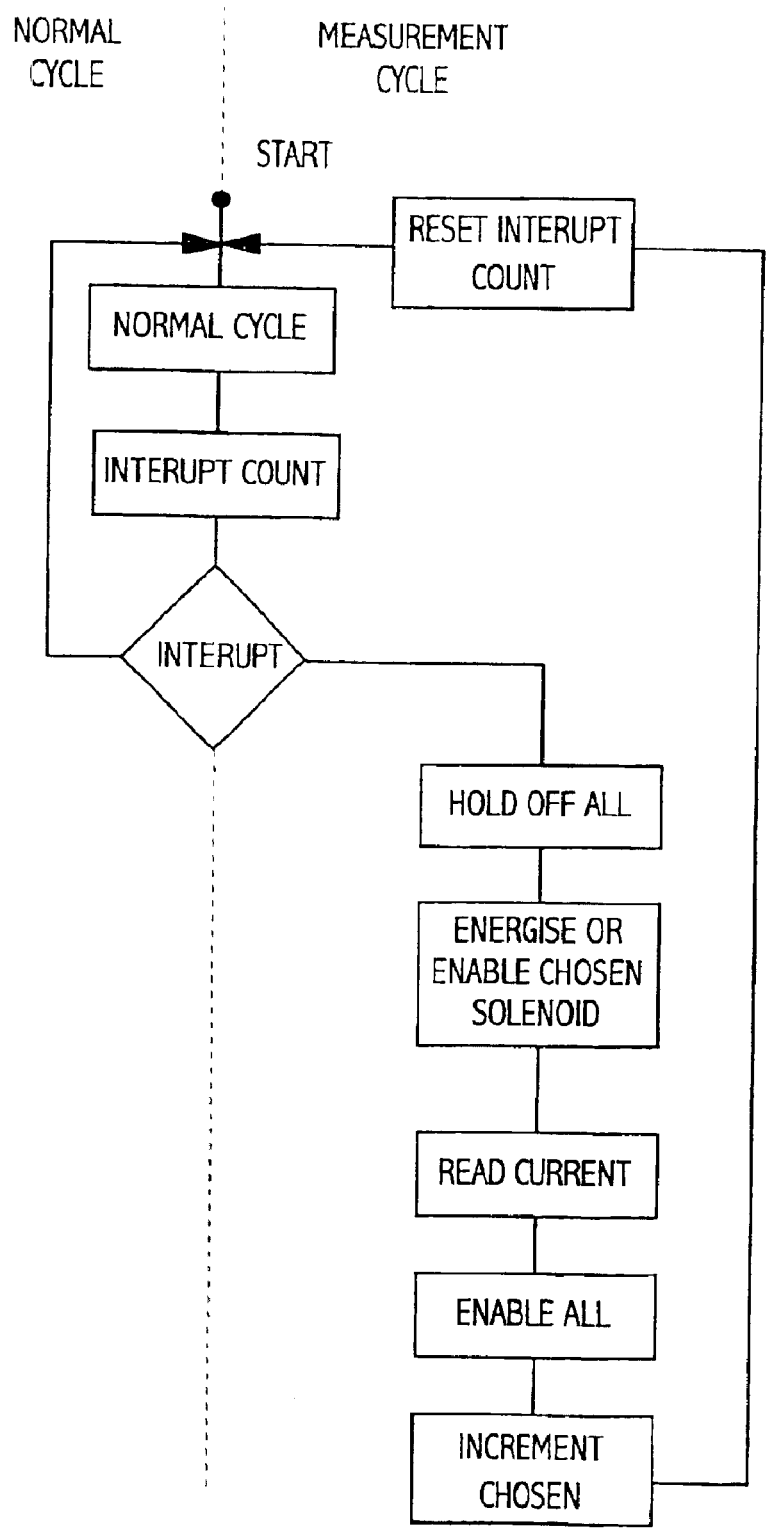
FIG. 7 is a modified flow diagram showing one preferred operation.

FIG. 3 shows an example of a typical practical situation where the use of the present invention can be of cost saving advantage. FIG. 3 illustrates an electro hydraulic braking system where braking demand signals are generated electronically at a travel sensor 29 in response to operation of a foot pedal 30, the signals being processed in an Electronic Control Unit (ECU) 32 for controlling the operation of brake actuators 34a, 34b at the front and back wheels respectively of a vehicle via pairs of valves 36a, 36b, 36c, 36d. The latter valves are operated in opposition to provide proportional control of actuating fluid the brake actuators 34 from a pressurized fluid supply accumulator 38, maintained from a reservoir 40 via a motor-driven pump 42. For use, for example, in emergency conditions when the electronic control of the brake actuator is not operational for some reason, the system includes a master cylinder 44 coupled mechanically to the foot pedal 30 and by which fluid can be supplied directly to the actuators 34 in a "push-through" condition. In the push-through condition, a fluid connection between the front brake actuators 34a and the cylinder 44 is established by means of digitally operating, solenoid operated valves 46a, 46b. Also included in the system are further digitally operating solenoid valves 48, 50 and 52 which respectively connect the two pairs of valves 36a, 36b, the pump 42 and accumulator 38 with the two pair of valves 36c, 36d.

The present system of monitoring solenoid coil currents can be applied to monitor the currents in the digitally operated valves 46a, 46b, 48, 50 and 52 by means of a common sensing element 24 and conditioning amplifier 26. It can also be applied to the control valve pairs 36a, 36b, 36c and 36d in the event that they are not provided for a proportional control mode.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. An arrangement for monitoring multiple channel solenoid currents comprising:
   a plurality of solenoid coils;
   a plurality of electrical switching devices, each of said switching devices connected to one end of one of said solenoid coils to form a plurality of separately controllable solenoid coil assemblies, said plurality of solenoid coil assemblies being connected in parallel to define first and second common electrical points for said plurality of solenoid coil assemblies, said first common electrical point being adapted to be connected to a first side of a current supply;
   a plurality of re-circulating diodes, each of said diodes associated with one of said solenoid coils and connected across said associated solenoid coil and operative, upon interruption of current flowing through said associated coil, to re-circulate said current through said coil; and
   a single current measurement element having a first end connected to said second common electrical point of said plurality of separately controllable solenoid coil assemblies, said current measurement element also having a second end adapted to be connected directly to a second side of said current supply, whereby the current flowing through each one of said solenoid coils can be individually measured.

2. The monitoring arrangement as claimed in claim 1 wherein the measurement element is coupled to a single analogue to digital converter via a signal conditioning amplifier for measurement purposes.

3. The monitoring arrangement as claimed in claim 2, wherein said plurality of separately controllable solenoid coils are adapted to be commonly connected by said single current measurement element to the low side of the current supply.

4. The monitoring arrangement as claimed in claim 3, wherein said switching device is a relay.

5. The monitoring arrangement as claimed in claim 3, wherein in order to enable the current through any one particular solenoid coil to be measured, means are included for, firstly, enabling a current measurement reading to be made only while a single respective drive element for that particular solenoid coil is switched on, and, secondly, switching on the drive element for only that particular coil when the current measurement reading is made, with all other drive elements being switched off.

6. The monitoring arrangement as claimed in claim 3, wherein said switching device is an electronic switching device.

7. The monitoring arrangement as claimed in claim 6, wherein said switching device is a field effect transistor.

8. The monitoring arrangement as claimed in claim 6, wherein said switching device is a bipolar transistor.

9. The monitoring arrangement as claimed in claim 1, wherein said plurality of separately controllable solenoid coils are coupled commonly by said single current measurement element to the low side of the current supply.

10. The monitoring arrangement as claimed in claim 9, wherein in order to enable the current through any one particular solenoid coil to be measured, means are included for, firstly, enabling a current measurement reading to be made only while a single respective drive element for that particular solenoid coil is switched on, and, secondly, switching on the drive element for only that particular coil when the current measurement reading is made, with all other drive elements being switched off.

11. The monitoring arrangement as claimed in claim 1, wherein in order to enable the current through any one particular solenoid coil to be measured, means are included for, firstly, enabling a current measurement reading to be made only while a single respective drive element for that particular solenoid coil is switched on, and, secondly, switching on the drive element for only that particular coil when the current measurement reading is made, with all other drive elements being switched off.

12. A method for monitoring multiple channel solenoid currents comprising the steps of:
  (a) providing a plurality of separately controllable solenoid coil assemblies, each of the coil assemblies including a solenoid coil having one end electrically connected to a corresponding electrical switching device, the plurality of separately controllable solenoid coil assemblies having a common electrical point that is connected to a first end of a single measurement element, the single measurement element having a second end that is connected to one side of a current supply, each of the solenoid coils also having a re-circulating diode connected across the coil that is operative, upon interruption of current flowing through the coil, to re-circulate the current through the coil; and
  (b) enabling a current measurement reading to be made for any selected one of the plurality of separately controllable solenoid coils.

13. The method for monitoring multiple channel solenoid currents as claimed in claim 12, further including the step of:
  (c) switching on only a single drive element associated with the current measurement in step (b) and switching off all the other drive elements associated with the other solenoid coils when the current measurement is made.

* * * * *